(12) United States Patent
Kondo (10) Patent No.: US 10,263,158 B2
(45) Date of Patent: Apr. 16, 2019

(54) LIGHT EMITTING ELEMENT

(71) Applicant: NICHIA CORPORATION, Anan-shi, Tokushima (JP)

(72) Inventor: Hiroki Kondo, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/384,545

(22) Filed: Dec. 20, 2016

(65) Prior Publication Data

US 2017/0186918 A1    Jun. 29, 2017

(30) Foreign Application Priority Data

Dec. 25, 2015 (JP) ................................. 2015-254272

(51) Int. Cl.

| | |
|---|---|
| *H01L 33/46* | (2010.01) |
| *H01L 33/42* | (2010.01) |
| *H01L 33/40* | (2010.01) |
| *H01L 33/38* | (2010.01) |
| *H01L 33/60* | (2010.01) |
| *H01L 33/44* | (2010.01) |
| *H01L 33/32* | (2010.01) |

(52) U.S. Cl.
CPC .............. *H01L 33/46* (2013.01); *H01L 33/38* (2013.01); *H01L 33/40* (2013.01); *H01L 33/42* (2013.01); *H01L 33/60* (2013.01); *H01L 33/32* (2013.01); *H01L 33/44* (2013.01)

(58) Field of Classification Search
CPC ......... H01L 33/36; H01L 33/38; H01L 33/46; H01L 33/60

USPC .......................................................... 257/98
See application file for complete search history.

(56) References Cited

U.S. PATENT DOCUMENTS

2008/0185606 A1    8/2008  Sano et al.
2009/0283787 A1*  11/2009  Donofrio .............. H01L 33/405
                                                257/98

(Continued)

FOREIGN PATENT DOCUMENTS

JP         2002-353506 A    12/2002
JP         2006-120913 A     5/2006

(Continued)

*Primary Examiner* — Marcos D. Pizarro
*Assistant Examiner* — Antonio B Crite
(74) *Attorney, Agent, or Firm* — Global IP Counsellors, LLP (57) ABSTRACT

A light emitting element includes: a semiconductor stack; a light reflecting layer, in which a dielectric multilayer film is included, on an upper surface of the semiconductor stack; a light transmissive insulating layer that covers the light reflecting layer and is provided on the upper surface of the semiconductor stack around the periphery of the light reflecting layer; a light transmissive conducting layer that covers the light transmissive insulating layer and is provided on the upper surface of the semiconductor stack around the periphery of the light transmissive insulating layer; and an electrode that is provided on an upper surface of the light transmissive conducting layer so that the outer edge of the electrode coincides with an outer edge of the light reflecting layer or the outer edge of the electrode is positioned at inside of the outer edge of the light reflecting layer, as seen from an upper surface side.

19 Claims, 7 Drawing Sheets (56) References Cited

U.S. PATENT DOCUMENTS

| | | | |
|---|---|---|---|
| 2010/0176413 A1* | 7/2010 | Lin | H01L 33/38 |
| | | | 257/98 |
| 2011/0233596 A1 | 9/2011 | Sano et al. | |
| 2012/0049219 A1* | 3/2012 | Kamiya | H01L 33/382 |
| | | | 257/98 |
| 2012/0085988 A1* | 4/2012 | Yu | H01L 33/38 |
| | | | 257/13 |
| 2014/0124730 A1 | 5/2014 | Choi et al. | |
| 2015/0076547 A1 | 3/2015 | Totani et al. | |
| 2016/0093667 A1 | 3/2016 | Choi et al. | |
| 2017/0279008 A1* | 9/2017 | You | H01L 33/405 |

FOREIGN PATENT DOCUMENTS

| | | | |
|---|---|---|---|
| JP | 2006120913 A | * | 5/2006 |
| JP | 2008-135554 A | | 6/2008 |
| JP | 2008-192690 A | | 8/2008 |
| JP | 2008-192710 A | | 8/2008 |
| JP | 2008-210903 A | | 9/2008 |
| JP | 2010-272592 A | | 12/2010 |
| JP | 2011-138820 A | | 7/2011 |
| JP | 2012-064647 A | | 3/2012 |
| JP | 2012-124321 A | | 6/2012 |
| JP | 2014-093532 A | | 5/2014 |
| JP | 2015-060886 A | | 3/2015 |

\* cited by examiner

LIGHT EMITTING ELEMENT

CROSS-REFERENCE TO RELATED APPLICATIONS

This application claims priority to Japanese Patent Application No. 2015-254272 filed on Dec. 25, 2015. The entire disclosure of Japanese Patent Application No. 2015-254272 is hereby incorporated herein by reference.

BACKGROUND

1. Technical Field

The present disclosure relates to a light emitting element.

2. Description of Related Art

There are known light emitting elements that have a light reflecting layer on the surface of a semiconductor stack in order for the light from the semiconductor stack to be extracted to the outside more efficiently. For instance, Patent Literature 1 (JP2006-120913A) discloses a light emitting element having a light transmissive conductive film composed of indium tin oxide (ITO) formed on a semiconductor stack, a reflective film formed over this, and an electrode layer containing gold and formed so as to be joined to part of the light transmissive conductive film around the periphery of the reflective film.

When the electrode is formed around the periphery of the reflective film to be in contact with part of the light transmissive conductive film, there is more than little light absorbed by an electrode layer without being reflected with a reflection film among the lights emitted from the semiconductor layer, therefore, the light extraction efficiency of the light emitting element may be reduced.

SUMMARY

A light emitting element includes: a semiconductor stack; a light reflecting layer, in which a dielectric multilayer film is included, on an upper surface of the semiconductor stack; a light transmissive insulating layer that covers the light reflecting layer and is provided on the upper surface of the semiconductor stack around the periphery of the light reflecting layer; a light transmissive conducting layer that covers the light transmissive insulating layer and is provided to the upper surface of the semiconductor stack around the periphery of the light transmissive insulating layer; and an electrode that is provided on an upper surface of the light transmissive conducting layer so that the outer edge of the electrode coincides with an outer edge of the light reflecting layer or the outer edge of the electrode is positioned at inside of the outer edge of the light reflecting layer, as seen from an upper surface side.

DETAILED DESCRIPTION

Embodiments for according to the light emitting element of the present invention will be described below with reference to the drawings. In the following embodiment of the light emitting element that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

It is an object of the present disclosure to provide a light emitting element with which light from the semiconductor stack can be extracted to the outside more efficiently.

With a light emitting element disclosed herein, light from the semiconductor stack can be extracted to the outside more efficiently.

As shown in FIGS. 1 and 2A to 2C, the light emitting element 10 according to an embodiment of the present disclosure includes a semiconductor stack 13, a light reflecting layer 14, in which a dielectric multilayer film 14a is included, on the upper surface of the semiconductor stack 13, a light transmissive insulating layer 15 that covers the light reflecting layer 14 and is provided on the upper surface of the semiconductor stack 13 around the periphery of the light reflecting layer 14, a light transmissive conducting layer 16 that covers the light transmissive insulating layer 15 and is provided on the upper surface of the semiconductor stack 13 around the periphery of the light transmissive insulating layer 15, and an electrode 12 that is provided on the upper surface of the light transmissive conducting layer 16 and so as to be positioned inside of the outer edge of the light reflecting layer 14, as seen from the upper surface side.

With this configuration, light propagating toward the electrode can be reflected by the light reflecting layer, thereby reducing light absorption by the electrode. Furthermore, the light transmissive insulating layer spreads the current supplied from the electrode to a region outside the region of the semiconductor stack located directly under the electrode, in other words, a region away from the light reflecting layer. The light transmissive insulating layer also increases the amount of light extracted to the outside by being transmitted using the light transmissive insulating layer without being reflected by the light reflecting layer. Therefore, light from the semiconductor stack can be extracted to the outside more efficiently.

Semiconductor Stack 13

Figure 2A:
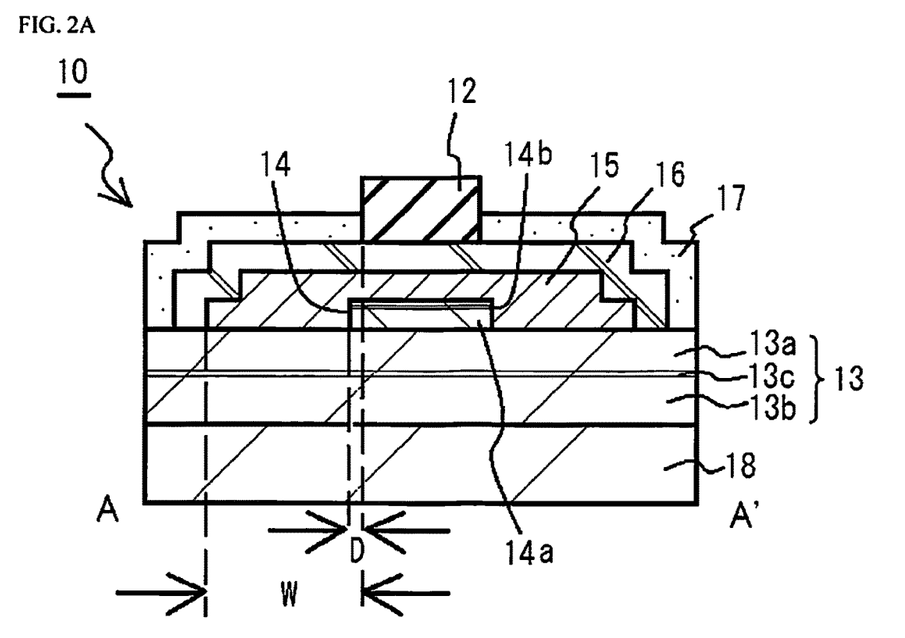
FIG. 2A is a schematic cross sectional view along the A-A' line in FIG. 1.
Figure 2B:
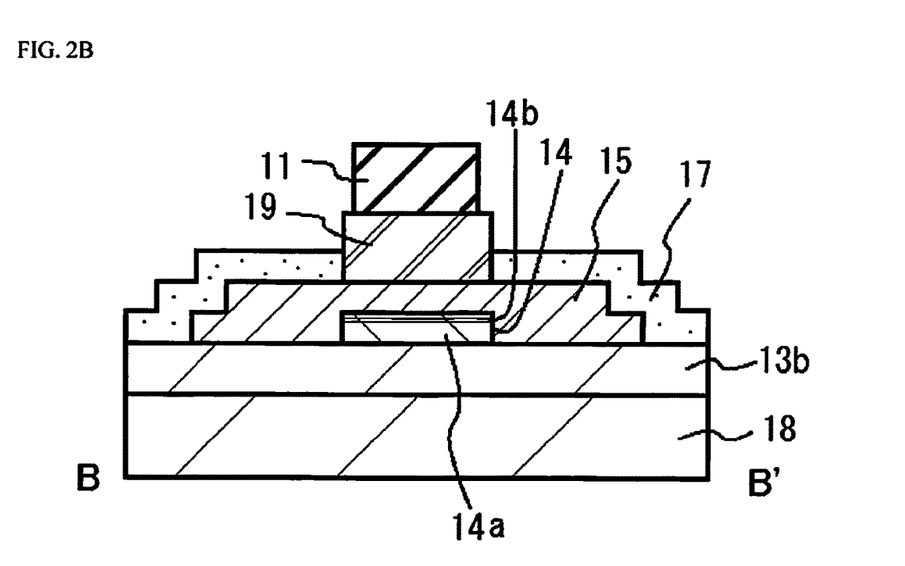
FIG. 2B is a schematic cross sectional view along the B-B' line in FIG. 1.
Figure 2C:
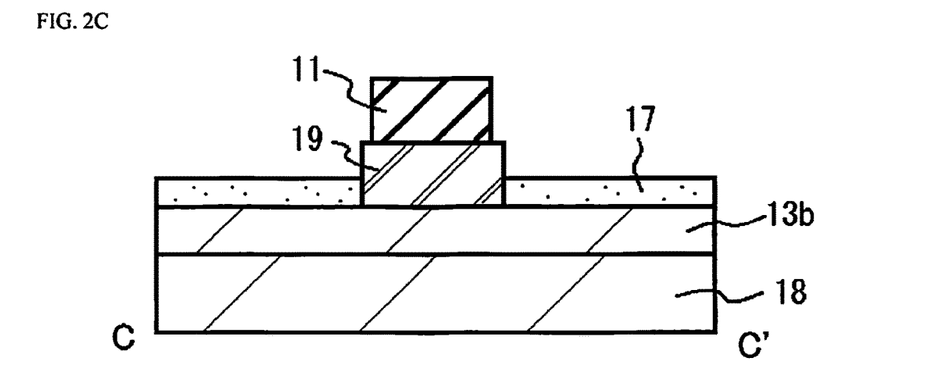
FIG. 2C is a schematic cross sectional view along the C-C' line in FIG. 1.

The semiconductor stack 13 is structured with, for example, an n-side semiconductor layer 13b, and a p-side semiconductor layer 13a which is provided above the n-side semiconductor layer 13b and in a region that is part of the n-side semiconductor layer 13b, by stacking each layer on the upper surface of a substrate 18. The semiconductor stack 13 emits light when current is applied between an n electrode 11 that is provided on the n-side semiconductor layer 13b and in a different region from the region in which the p-side semiconductor layer 13a is provided, and that is electrically connected to the n-side semiconductor layer 13b, and a p electrode 12 that is provided on the p-side semiconductor layer 13a and is electrically connected to the p-side semiconductor layer 13a. Also, the semiconductor stack 13 preferably has an active layer 13c between the n-side semiconductor layer 13b and the p-side semiconductor layer 13a. Using the light emitting region (corresponding to the active layer in this embodiment) as a reference, the semiconductor on the side where the n electrode 11 is connected is the n-side semiconductor layer 13b, and the semiconductor on the side where the p electrode 12 is connected is the p-side semiconductor layer 13a.

A nitride semiconductor expressed by $In_XAl_YGa_{1-X-Y}N$ ($0 \leq X$, $0 \leq Y$, $X+Y<1$) is preferably used as the material for this semiconductor stack, for example.

The substrate is used to support the semiconductor stack, and may be a growth substrate for epitaxially growing a semiconductor stack. The material of this substrate can be sapphire ($Al_2O_3$), for example. However, this substrate may be removed from the light emitting element in this embodiment.

Light Reflecting Layer 14

The light reflecting layer 14 is used to downwardly reflect the light from the semiconductor stack propagating toward the electrode, and is able to reflect at least 80% of this light, and preferably at least 90%. The light reflecting layer is provided on the upper surface of the semiconductor stack, and is preferably contact with the upper surface of the semiconductor stack. The "upper surface of the semiconductor stack" here may be either the upper surface of the above-mentioned p-side semiconductor layer or the upper surface of the n-side semiconductor layer (that is, the surface of the n-side semiconductor layer in a different region from the region where the p-side semiconductor layer is provided, as seen from the upper surface side). The light reflecting layer is preferably provided to the upper surface of the p-side semiconductor layer so that light from the semiconductor stack can be effectively reflected. For example, the light reflecting layer may not be provided to the upper surface of the n-side semiconductor layer, and may be provided only to the upper surface of the p-side semiconductor layer. In this case, the light transmissive insulating layer discussed below can be provided directly on the upper surface of the n-side semiconductor layer.

The light reflecting layer has a shape substantially aligned with an outer edge of the electrode discussed below as seen from the upper surface side. The width of the light reflecting layer as seen from the upper surface side is either greater than the width of the electrode or the same as the width of the electrode, in order to reduce the light absorption by the electrode. From the standpoint of light extraction efficiency, the width of the light reflecting layer is preferably the same as the width of the electrode.

This light reflecting layer 14 can be formed, for example, by a layer containing silver, aluminum, or an alloy of these, or a layer including a dielectric film, and it is particularly preferable for it to be formed by a layer including a dielectric multilayer film 14a.

A DBR (distributed Bragg reflector) film is an example of the layer including the dielectric multilayer film 14a. A DBR film is, for example, a multilayer structure in which a plurality of sets (such as two to five sets) of dielectrics, each set having a low-refractive index layer and a high-refractive index layer, are stacked on an underlayer composed of an oxide film and is able to selectively reflect light of a predetermined wavelength. More specifically, the dielectric multilayer films (i.e., DBR film) can be alternately stacked, having different refractive indices to one another, and having thicknesses to reflect a quarter of wavelength of light. Consequently, the dielectric multilayer films can reflect the predetermined wavelength in a highly efficient manner. The DBR film can be one containing a nitride or an oxide of one or more elements selected from the group having Si, Ti, Zr, Nb, Ta and Al. The total thickness of the DBR film is preferably about 0.2 μm to 1 μm.

In the case where the DBR film is formed of an oxide film, the low-refractive index layer can be formed of $SiO_2$, the high-refractive index layer can be formed of $Nb_2O_5$, $TiO_2$, $Ti_3O_5$, $Ti_2O_3$, $TiO$, $Ta_2O_5$, $ZrO_2$, $TiO_2ZrO_2$, $Nb_2O_5$ or $Al_2O_3$, for example, and more specifically can be formed of $(Nb_2O_5/SiO_2)_n$ ("n" is a number from 2 to 5), starting from the underlayer side.

The light reflecting layer 14 preferably includes a metal film 14b in addition to the dielectric multilayer film 14a, so that the light passing through the dielectric multilayer film is effectively reduced. The metal film 14b can be formed on the dielectric multilayer film at a farther side from the light emitting layer. Examples of the metal film 14b include single-layer and stacked films, which are made of silver, aluminum, copper, or an alloy of these (such as an AlCu alloy or an AlNd alloy, which have excellent heat resistance). Thus, light directed at the light reflecting layer from an oblique angle, which cannot be completely reflected by the dielectric multilayer film, can be effectively reflected by disposing the metal film on the light reflecting layer. The thickness of the metal film is about 0.01 μm to 1 μm, for example. The metal film is also preferably completely covered on its upper surface by an insulating film in order to prevent short circuiting and degradation during processing and operation. This insulating film is one of the films constituting the light reflecting layer, and is a different film from the light transmissive insulating layer discussed below, and can be formed of the material constituting the above-mentioned dielectric multilayer film, for example.

Light Transmissive Insulating Layer 15

The light transmissive insulating layer 15 is used to spread the current supplied the current supplied from the electrode to a region outside the region where the light reflecting layer is disposed. The region where the light reflecting layer is disposed includes a region directly under the electrode. A material is used which can transmit at least light from the semiconductor stack produced in this outside region. For instance, the light transmissive insulating film preferably transmits at least 60%, and more preferably at least 90%, of the light from the semiconductor stack.

The light transmissive insulating layer 15 covers the light reflecting layer 14 and a its vicinity area of the upper surface of the semiconductor stack 13. The light transmissive insulating layer covers not only the upper surface of the light reflecting layer, but also the lateral surfaces. Therefore, particularly when a metal film is included in the light reflecting layer, the metal film is less likely to be damaged by the etching, heat treatment, and so forth that are performed during manufacture, and as a result, the light reflecting layer is be able to retain its function over an extended period of time.

The light transmissive insulating layer 15 preferably makes use of a material with a refractive index below that of the semiconductor layer, which is in contact with the light transmissive insulating layer, among the plurality of semiconductor layer that make up the semiconductor stack (hereinafter also referred to simply as the "contact layer"), in order to extract light more effectively from the semiconductor stack. Here, in the case that the semiconductor stack is made up of a nitride semiconductor, the contact layer is typically composed of GaN. The term "refractive index" as used in this Specification refers to the refractive index at the wavelength of the light emitted from the semiconductor stack, unless otherwise specified. The refractive index of the light transmissive insulating layer is preferably at least 0.2 less than the refractive index of the contact layer, for example, and more preferably at least 0.4 less than the refractive index of the contact layer. Also, the light transmissive insulating layer is more preferably a material whose refractive index is higher than that of the light transmissive conducting layer, so that light is effectively transmitted to the light transmissive conducting layer discussed below. More specifically, examples of the material used for the light transmissive insulating layer include oxides of, nitrides of, and oxynitrides of Zr, Si, V, Nb, Hf, Ta, Al, Ce, In, Sb, Zn and the like. It is especially preferable to use SiN exhibiting refractive index of approximately 2.01. The material used for the light transmissive insulating layer preferably has a refractive index that is about the same as or is less than that of the contact layer, and has a refractive index that is about the same as or is greater than that of the light transmissive conducting layer discussed below (such as ITO, whose refractive index with respect to light having a wavelength of about 455 nm is approximately 1.97). This moderates the reflection of light at the boundary with the light transmissive conducting layer, and allows light from the semiconductor stack to be extracted more efficiently to the outside.

The thickness of the light transmissive insulating layer is in a range about 100 nm to about 300 nm, for example.

Light Transmissive Conducting Layer 16

The light transmissive conducting layer 16 serves to spread the current supplied from the electrode so that the current flows over a region wider than the semiconductor stack. In this embodiment, the light transmissive conducting layer is preferably disposed on substantially the entire upper surface of the p-side semiconductor layer, except for the region in which the light transmissive insulating layer is formed. The term "substantially the entire upper surface" here refers to the region of the upper surface of the p-side semiconductor layer except for the outer edge. For example, the light transmissive conducting layer is preferably provided over at least 90% of the upper surface of the p-side semiconductor layer. Also, the light transmissive conducting layer may be provided on the upper surface of the n-side semiconductor layer, in the same manner as the upper surface of the p-side semiconductor layer.

The light transmissive conducting layer 16 is made of a material that can transmit at least 60%, of preferably at least 90%, of the light from the semiconductor stack, in order for the light from the semiconductor stack to be extracted to the outside more efficiently. The material of this light transmissive conducting layer is preferably an oxide containing one or more elements selected from the group consisting of zinc, indium, tin, and magnesium. Examples include ITO (indium oxide), ZnO (zinc oxide), $In_2O_3$ (indium oxide), $SnO_2$ (tin oxide), and composites of these, such as IZO (indium oxide and zinc oxide), with ITO being especially preferable.

The light transmissive conducting layer can have a thickness of, for example, at least about 50 nm allowing the forward voltage to be reduced, and no more than about 300 nm allowing optical loss caused by propagation of light from the semiconductor stack through a medium).

Electrodes 11 and 12

The electrodes are provided to the upper surface of the light transmissive conducting layer 16 or a conducting layer 19. All or part of the outer edges of the electrodes coincide with the outer edge of the light reflecting layer 14, or are positioned inside the outer edge thereof, as seen from the upper surface side. The electrode here may be either the electrode 11 electrically connected to the n-side conducting layer or the electrode 12 electrically connected to the p-side conducting layer, but is preferably the electrode 12 electrically connected to the p-side semiconductor layer 13a (so called a p-electrode). The coincidence here preferably complete overlap, however taking into account working accuracy during manufacture, variance of about ±2 μm is permitted, but is preferably no more than ±1 μm.

The minimum distance of the outer edge of the electrodes, in particular, the p electrode 12, from the outer edge of the light reflecting layer 14 is preferably no more than 2 μm. Also, the minimum distance of the outer edge of the p electrode 12 from the outer edge of the light transmissive insulating layer 15 is preferably no more than 4 μm. With this layout, the current supplied from the electrode can spread to the entire semiconductor stack, and also minimizes the absorption of light by the electrode, therefore light can be extracted more efficiently.

Examples of the material used for the electrodes include Au, Pt, Pd, Rh, Ni, W, Mo, Cr, Ti, Al, Cu, and alloys thereof. More specifically, the electrodes can have a stacked structure such as Ti/Pt/Au, Cr/Pt/Au, or CrRh alloy/Pt/Au, starting from the semiconductor stack side.

EXAMPLE 1

As shown in FIG. 1 and FIGS. 2A to 2C, the light emitting element 10 in Example 1 includes: the semiconductor stack 13 whose outer edge is approximately rectangular as seen from the upper surface side; the light reflecting layer 14, in which the dielectric multilayer film 14a is included on the upper surface of the semiconductor stack 13; the light transmissive insulating layer 15 that covers the light reflecting layer 14 and is provided on the upper surface of the semiconductor stack 13 around the light reflecting layer 14; the light transmissive conducting layer 16 that covers the light transmissive insulating layer 15 and is provided on the upper surface of the semiconductor stack 13 around the light transmissive insulating layer 15; and the p electrode 12 that is provided on the upper surface of the light transmissive conducting layer 16 so as to be positioned inside of the outer edge of the light reflecting layer 14 as seen from the upper surface side. The semiconductor stack 13 is formed on the substrate 18 (composed of sapphire), and has the n-side semiconductor layer 13b, the active layer 13c, and the p-side semiconductor layer 13a, in that order from the substrate 18 side.

The upper surface of the semiconductor stack 13 includes the upper surface of the p-side semiconductor layer 13a and the upper surface of the n-side semiconductor layer 13b (a region in which the n-side semiconductor layer 13b is exposed by the removal of portion of the active layer and the p-side semiconductor layer 13a on part of the outer peripheral side of the semiconductor stack 13). The n electrode 11 is provided to the upper surface of the n-side semiconductor layer 13b via the conducting layer 19, which is connected to the p electrode 12 on the same surface side. The length of the sides of the light emitting element 10 as seen from the upper surface side are about 850 mm×about 240 mm.

The light reflecting layer 14 is disposed on the upper surface of the p-side semiconductor layer 13a and on the upper surface of the n-side semiconductor layer 13b, as seen from the upper surface side. On the upper surface of the p-side semiconductor layer 13a, the light reflecting layer 14 extends in a narrow band in the lengthwise direction, spreading wider at one end. The width of the extending portion is approximately 3 μm, for example, and the wider portion has an approximately circular shape, having a diameter of approximately 70 μm. The light reflecting layer 14 disposed on the upper surface of the n-side semiconductor layer 13b has a plurality of extending portions arranged in the lengthwise direction, and has an approximately circular part at one end. The circular part is located on a deviated region from a row of the extending portions in the top view.

The light reflecting layer 14 has an $SiO_2$ film as its bottom layer with a thickness of approximately 228 nm, on which two pairs of dielectric multilayer films 14a of $TiO_2/SiO_2$ are disposed with a thickness of approximately 44 nm/approximately 76.3 nm, on which an AlCu film is disposed as the metal film 14b with a thickness of approximately 100 nm, and an $SiO_2$ film 14c with an approximately 150 nm thickness is formed so as to completely cover this AlCu film. The films constituting these light reflecting layers 14 (i.e., the dielectric multilayer film 14a, the metal film 14b, and the $SiO_2$ film 14c) each have lateral surfaces approximately matching with one another.

The light transmissive insulating layer 15 is disposed so as to reach the upper surface of the p-side semiconductor layer 13a and to surround the entire periphery of the light reflecting layer 14 on the upper surface of the p-side semiconductor layer 13a. The width from the outer edge of the p electrode 12 to the outer edge of the light transmissive insulating layer 15 (i.e., W in FIG. 2A) is approximately 4 μm, for example. On the upper surface of the n-side semiconductor layer 13b, the light transmissive insulating layer 15 is disposed so as to reach the upper surface of the n-side semiconductor layer 13b and to surround the entire periphery of the light reflecting layer 14 at each of the above-mentioned extending portions and the circular part. On the n-side semiconductor layer, the width W is the same as that on the p-side semiconductor layer. The light transmissive insulating layer 15 is formed of an $SiO_2$ film with approximately 150 nm thick.

The light transmissive conducting layer 16 covers substantially the entire upper surface of the p-side semiconductor layer 13a except for the outer periphery thereof, and is in ohmic contact in the contact region with the p-side semiconductor layer 13a around the light transmissive insulating layer 15. The light transmissive conducting layer 16 is formed of ITO with a thickness of approximately 60 nm. The light transmissive conducting layer 16 may be disposed on the upper surface of the n-side semiconductor layer 13b, but is not disposed there in FIG. 1 and FIGS. 2A to 2C.

The entire outer edge of the p electrode 12 is positioned inside of the outer edge of the light reflecting layer 14 as seen from the upper surface side, and the distance between the outer edges (D in FIG. 2A) is approximately 2 μm. The p electrode 12 is formed of CrRh alloy/Pt/Au with thicknesses of approximately 3 nm/approximately 50 nm/approximately 1600 nm, and stacked from the p-side semiconductor layer 13a side in this order.

Figure 1:
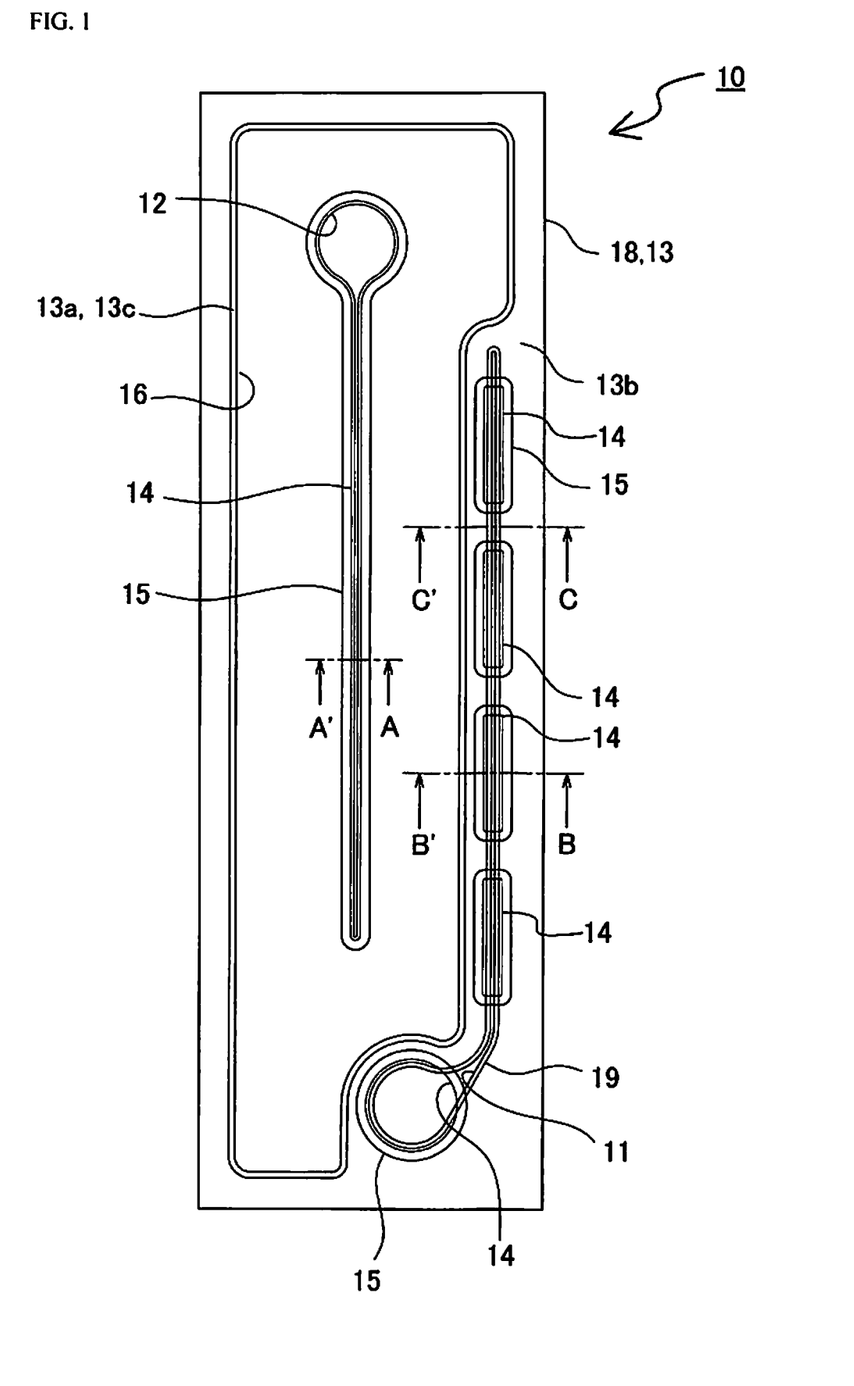
FIG. 1 is a schematic plan view of the light emitting element according to an embodiment of the present invention.

The exposed region of the n-side semiconductor layer 13b is arranged along the two sides (i.e., long sides) of the semiconductor stack 13, and is arranged in a wide area at the positions around short sides. The n electrode 11 is disposed with the conducting layer 19 interposed. The conducting layer 19 is formed of Ti/AlCu/Ti/Ru with thicknesses of approximately 0.6 nm/approximately 500 nm/approximately 150 nm/approximately 100 nm, and stacked from the n-side semiconductor layer 13b side in this order. The n electrode 11 is formed of CrRh alloy/Pt/Au with thicknesses of approximately 3 nm/approximately 50 nm/approximately 1600 nm, and stacked from the n-side semiconductor layer 13b side in this order. Consequently, the n electrode 11 is connected to the semiconductor stack 13 on about 5% of the surface area of the semiconductor stack 13, as the total surface area of the entire exposed part.

With this configuration, light propagating toward the electrode can be reflected by the light reflecting layer 14, so less light is absorbed by the electrode. The light transmissive insulating layer 15 spreads the current supplied from the electrode to the region to the outside of the region of the semiconductor stack 13 located directly under the electrode, in other words, a region that is away from the light reflecting layer 14. Therefore, more light can be transmitted by the light transmissive insulating layer 15, with less light reflected by the light reflecting layer 14, thereby allowing light to be efficiently extracted to the outside. Moreover, since the light reflecting layer 14 is substantially completely covered by the light transmissive insulating layer 15, and the metal film 14b constituting the light reflecting layer 14 is less likely to be damaged during manufacture. Therefore, the light reflecting layer 14 can stably maintain its function over an extended period with less deterioration. Accordingly, the light emitting element can have enhanced reliability and light extraction efficiency.

Such light emitting element can be manufactured by the following method as shown in FIG. 3, for example.

Figure 3A:
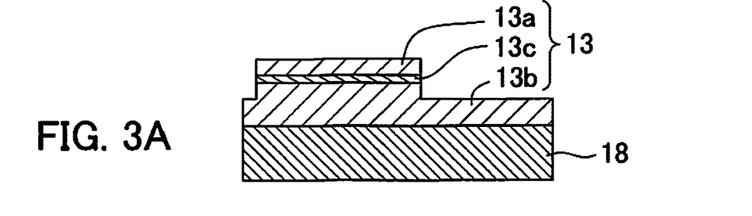
FIGS. 3A to 3K are schematic cross sectional views showing the steps for manufacturing the light emitting element in FIG. 1.

As shown in FIG. 3A, a step is provide the semiconductor stack 13, which is stacked on the upper surface of the substrate 18 and includes the n-side semiconductor layer 13b, the active layer 13c and and the p-side semiconductor layer 13a. The p-side semiconductor layer 13a and the active layer 13c are stacked above the n-side semiconductor layer 13b and on a portion of the n-side semiconductor layer 13b.

Figure 3B:
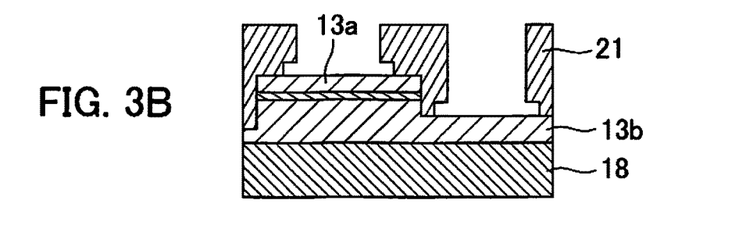

Subsequently, as shown in FIG. 3B, a liftoff pattern 21 having openings is formed with a resist layer in a portion above the p-side semiconductor layer 13a and in the part above the n-side semiconductor layer 13b where the p-side semiconductor layer 13a does not exist.

Figure 3C:
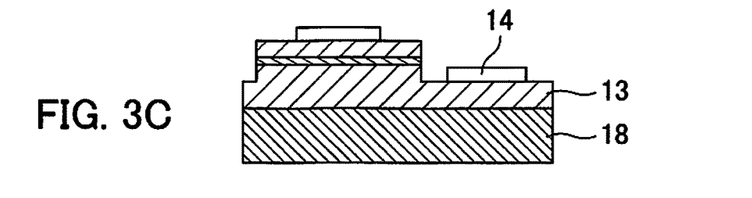

After the light reflecting layer 14 is formed on an upper surface of the pattern 21 and on the upper surface of the semiconductor stack 13 exposed in the openings thereof, liftoff is performed to form the light reflecting layer 14 in a predetermined region as shown in FIG. 3C.

Figure 3D:
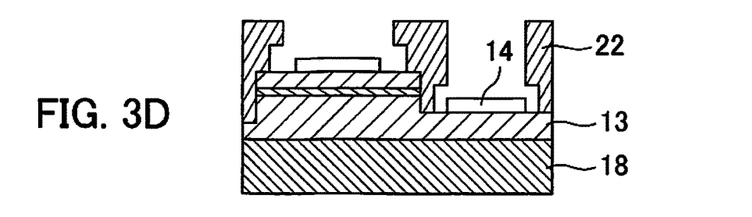

As shown in FIG. 3D, a liftoff pattern 22 is formed on the semiconductor stack 13 with a resist layer while having openings on portions of the semiconductor stack 13 so as to surround the light reflecting layer 14 without contacting the the light reflecting layer 14.

Figure 3E:
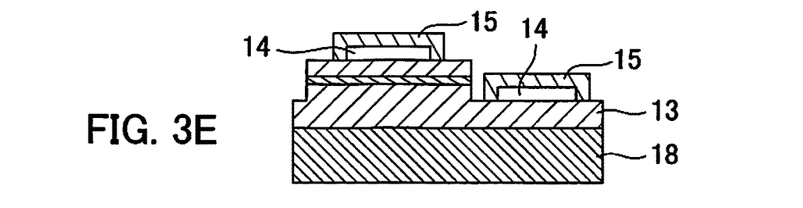
Figure 3F:
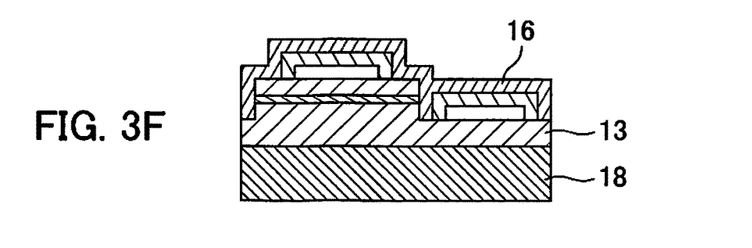
Figure 3G:
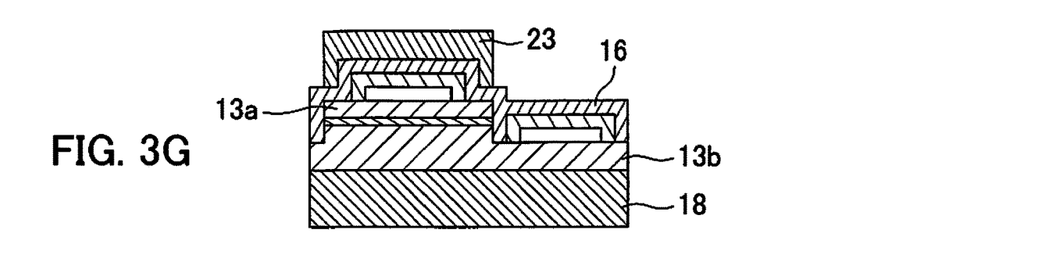

Subsequently, the light transmissive insulating layer 15 is formed on an upper surface of the pattern 22, and on the upper surface of the light reflecting layer 14 and the upper surface of the semiconductor stack 13 exposed in the openings thereof, thereafter the light transmissive insulating layer 15 that covers the light reflecting layer 14 is formed as shown in FIG. 3E by liftoff method. As shown in FIG. 3F, the light transmissive conducting layer 16 is formed on the upper surface of the semiconductor stack 13 and the upper surface of the light transmissive insulating layer 15, thereafter a mask 23 is formed on the upper surface of the light transmissive conducting layer 16 above the p-side semiconductor layer 13a, as shown in FIG. 3G.

Figure 3H:
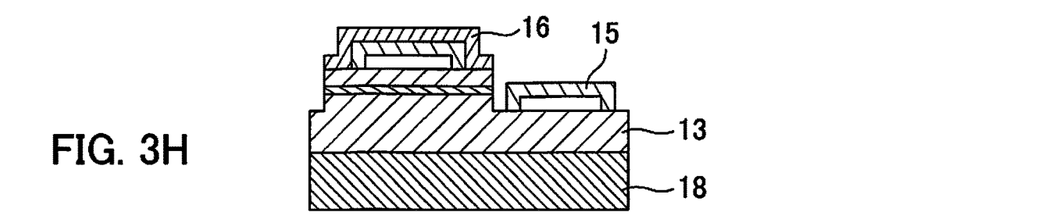

The light transmissive conducting layer 16 is formed by etching using this mask 23, and then the mask 23 is removed as shown in FIG. 3H.

Figure 3I:
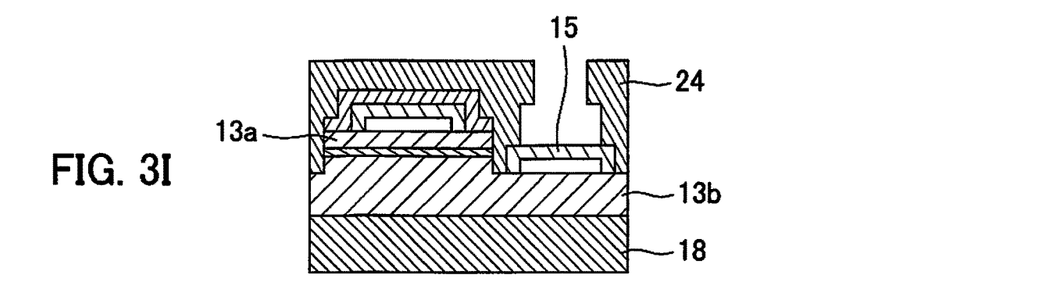

As shown in FIG. 3I, a liftoff pattern 24 is formed on the n-side semiconductor layer 13b with a resist layer while having an opening in a part of the upper surface of the light transmissive insulating layer 15 and on the n-side semiconductor layer 13b where the p-side semiconductor layer 13a is not stacked.

Figure 3J:
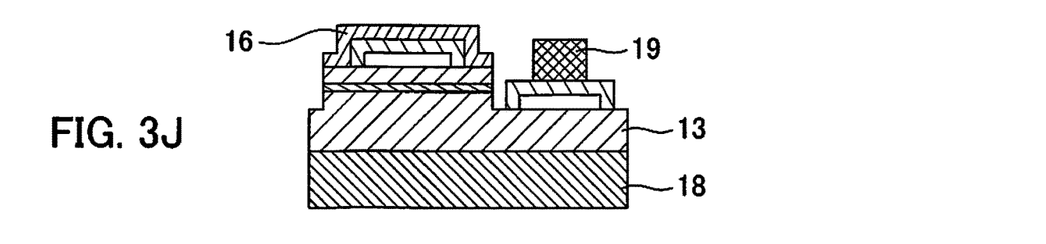

The conducting layer 19 is formed on an upper surface of the pattern 24 and on the upper surface of the light transmissive insulating layer 15 exposed through the opening thereof, thereafter liftoff is performed to form the conducting layer 19 shown in FIG. 3J.

Figure 3K:
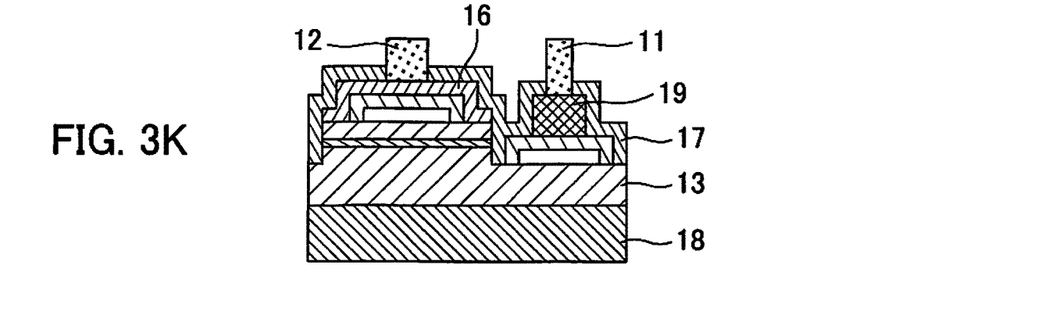

Subsequently, a protective film 17 is formed over the entire surfaces at the upper surface side of the semiconductor stack 13. A mask having an opening in parts above the light transmissive conducting layer 16 and the conducting layer 19 is formed on the upper surface of the protective film 17. The protective film 17 exposed in this opening is then removed, and then the same mask is used to form an electrode material on the upper surface of the conducting layer 19 and the upper surface of the light transmissive conducting layer 16 exposed from the protective film 17, thereafter liftoff is performed to form the p electrode 12 and then electrode 11 as shown in FIG. 3K.

With such method, even when the light reflecting layer 14 includes a metal film, since the metal film is covered by the light transmissive conducting layer 16, the light transmissive conducting layer 16 is not exposed to the chemical solution used during etching, for example. Therefore, damage and degradation of the metal film during manufacturing can be avoided. Also, since the metal film is protected from the external environment by the light transmissive conducting layer 16, the metal film is less likely to be damaged or deteriorated during use as a light emitting element.

EXPERIMENT EXAMPLE 1

Figure 4A:
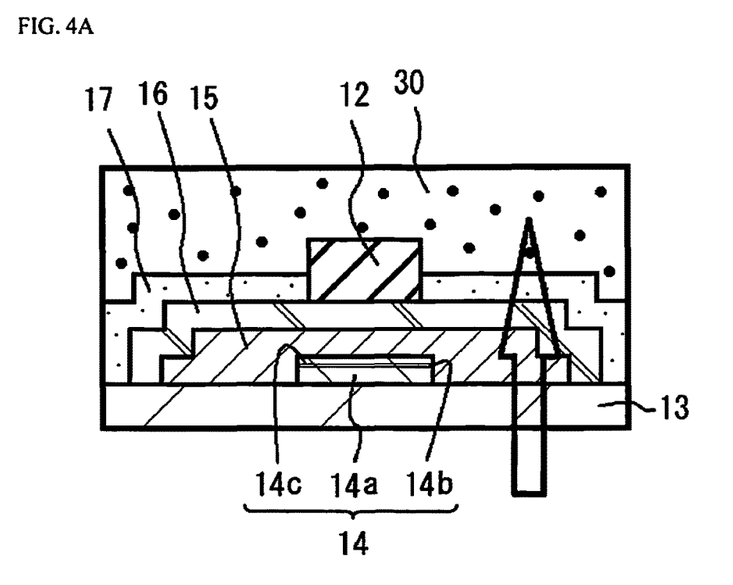
FIG. 4A is a schematic cross sectional view of a light emitting element, showing the location where a simulation of integrated transmittance is performed.

As a model of the state of a light emitting device in which the light emitting element 10 obtained in Example 1 is covered by a sealing member, as shown in FIG. 4A, a stack was formed of a contact layer composed of GaN (refractive index of 2.42) and located at the top of the plurality of semiconductor layers constituting the semiconductor stack 13, the light transmissive insulating layer 15, the light transmissive conducting layer 16 (ITO, refractive index of 2.01), the protective film 17 (SiO$_2$, refractive index of 1.97), and a sealing member 30 (silicone resin, refractive index of 1.55), and the integrated transmissivity assuming the particular location indicated by the arrow was calculated by simulation. TiO$_2$ (refractive index of 2.6), SiN (refractive index of 2.0), and SiO$_2$ (refractive index of 1.49) were used for the light transmissive insulating layer 15. The term "refractive index" used herein is with respect to light of about 455 nm, corresponding to the wavelength of light from the light emitting element.

As a comparative example, a simulation was also performed for a light emitting element the same as the light emitting element 10 in Example 1 except that there was no light transmissive insulating layer 15.

Figure 4B:
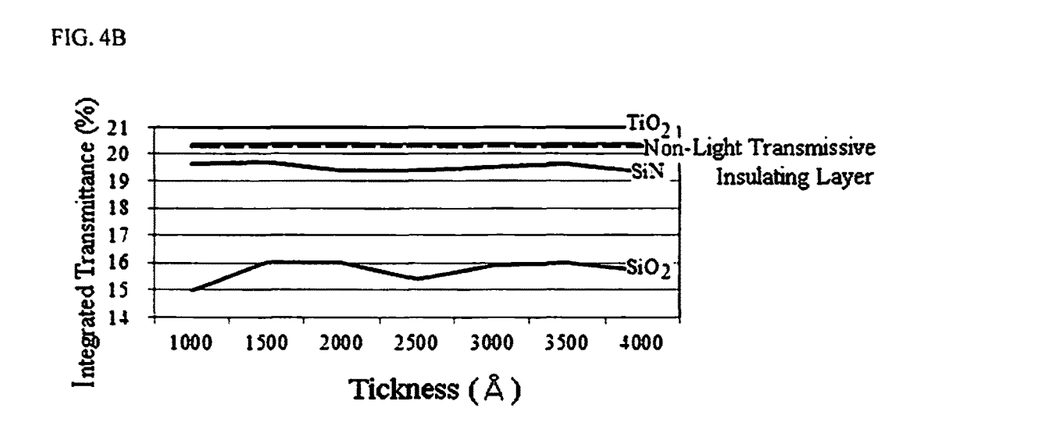
FIG. 4B is a graph of the relation of integrated transmittance to the thickness and type of light transmissive insulating layer in the light emitting element in FIG. 4A.
Figure 5:
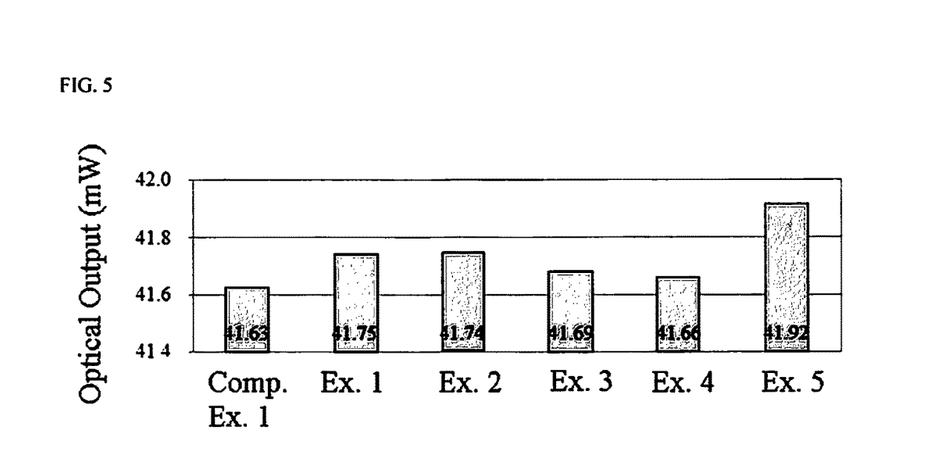
FIG. 5 is a graph of the optical output of the light emitting elements according to Examples 1 to 5 of the present invention and a comparative example.

As a result, as shown in FIG. 4B, the light emitting element with no light transmissive insulating layer 15 (the solid line in FIG. 4B) had an integrated transmissivity of at least 20%. On the other hand, with the light emitting element having the light transmissive insulating layer 15, it can be seen that the higher is the refractive index of the material used for the light transmissive insulating layer 15, the closer is the integrated transmissivity to that of the light emitting element without the light transmissive insulating layer 15, due to the use of TiO$_2$ (refractive index of 2.6), which is a material close to the refractive index of the GaN used for the contact layer, or SiN (refractive index of 2.0), which is a material close to the refractive index of the light transmissive conducting layer. Other than SiN, an example of a material close to the refractive index of the light transmissive insulating layer 15 is SiON.

That is, even though the light reflecting layer 14 is formed on the p-side semiconductor layer 13a, and the light transmissive insulating layer 15 is formed so as to cover the light reflecting layer 14, as long as a material with a high refractive index, and particularly a material that is close to the refractive index of the light transmissive conducting layer 16 or the refractive index of the contact layer included in the semiconductor stack 13, is used for the light transmissive insulating layer 15, thus, light absorption or other disturbance by the light transmissive insulating layer 15, and the light extraction efficiency can be maintained or increased regardless of whether or not the light transmissive insulating layer 15 exist.

The thickness of the light transmissive insulating layer 15 is preferably in a range about 100 nm to about 200 nm, at which a further increase in integrated transmissivity is seen, and particularly when SiN is used as the light transmissive insulating layer 15, in a range about 100 nm to about 150 nm is more preferable, and when SiO$_2$ is used, in a range about 150 nm to about 200 nm is more preferable, as can be seen.

Because of this, it can be understood that the relation between the refractive indexes of the contact layer, the light transmissive insulating layer 15, and the light transmissive conducting layer 16 is preferably such that the contact layer the light transmissive insulating layer 15 the light transmissive conducting layer 16, and more preferably the contact layer (such as GaN)>the light transmissive insulating layer 15 (such as SiN or SiON)≈the light transmissive conducting layer 16 (such as ITO), or the contact layer (such as GaN)≈the light transmissive insulating layer 15 (such as TiO$_2$)>the light transmissive conducting layer 16 (such as ITO).

EXPERIMENT EXAMPLE 2

Light emitting elements were produced by varying the material of the light transmissive insulating layer 15, the distance D between the outer edge of the p electrode 12 and the outer edge of the light reflecting layer 14 in FIG. 2A, and the distance W between the outer edge of the p electrode 12 and the outer edge of the light transmissive insulating layer 15 as shown in the table below, and the optical output (mW) at 20 mA of current was measured. In the comparative example, the light emitting element was the one from Example 1, but with no light reflecting layer 14.

|  | Material of light transmissive insulating layer | Distance D | Distance W |
|---|---|---|---|
| Comp. Example | SiO$_2$ | — | — |
| Example 1 | SiO$_2$ | 2 µm | 4 µm |
| Example 2 | SiO$_2$ | 1 µm | 5 µm |
| Example 3 | SiO$_2$ | 2 µm | 5 µm |
| Example 4 | SiO$_2$ | 3 µm | 5 µm |
| Example 5 | SiON | 2 µm | 4 µm |

As a result, it was found that optical output rose in all of the above-mentioned Examples 1 to 5 as compared to the light emitting element without a light reflecting layer 14.

Also, because the optical output in Example 1 is higher than that in Example 3, it can be seen that keeping the light transmissive insulating layer 15 to a minimum area on the upper surface of the semiconductor stack 13 is effective in terms of increasing the optical output.

Furthermore, it is shown in Examples 2 to 4 that the less size the light reflecting layer 14 is, the greater the optical output becomes. Therefore, it is expected that optical output is greatly increased by having the outer edge of the light reflecting layer 14 coincide with the outer edge of the electrode.

In addition, it can be seen from Examples 1 and 5 that using a material with a high refractive index for the light transmissive insulating layer 15, in other words, one that is close to the refractive index of the light transmissive conducting layer 16, is effective for increasing optical output.

INDUSTRIAL APPLICABILITY

A light emitting element according to the present disclosure can be suitably employed for projector apparatus, various types of lighting for the automotive, camera flash, LCD display backlight, various types of lighting apparatuses, large displays, various type of display devices such as advertising, destination guide, furthermore, image reading apparatuses such as digital video camera, facsimile, copying machine, and scanner, etc.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting element comprising:
a semiconductor stack including a first semiconductor layer and a second semiconductor layer laminated over the first semiconductor layer;
a light reflecting layer including a dielectric multilayer film, the light reflecting layer being arranged on an upper surface of the second semiconductor layer of the semiconductor stack;
a light transmissive insulating layer that covers the light reflecting layer and is in direct contact with the upper surface of the second semiconductor layer of the semiconductor stack around the periphery of the light reflecting layer;
a light transmissive conducting layer that covers the light transmissive insulating layer and is in direct contact with the upper surface of the second semiconductor layer of the semiconductor stack around the periphery of the light transmissive insulating layer; and
an electrode that is provided on an upper surface of the light transmissive conducting layer so that an outer edge of the electrode coincides with an outer edge of the light reflecting layer or the outer edge of the electrode is positioned at inside of the outer edge of the light reflecting layer, as seen from an upper surface side of the light emitting element.

2. The light emitting element according to claim 1, wherein
the light transmissive conducting layer is made up of an oxide containing one or more elements selected from the group having zinc, indium, tin and magnesium.

3. The light emitting element according to claim 1, wherein
the semiconductor stack is made up of a nitride semiconductor.

4. The light emitting element according to claim 1, wherein
the light reflecting layer further includes a metal film, and
the metal film is provided on an upper surface of the dielectric multilayer film.

5. The light emitting element according to claim 4, wherein
the metal film contains aluminum or silver.

6. The light emitting element according to claim 5, wherein
the metal film is made up of an AlCu alloy or an AlNd alloy.

7. The light emitting element according to claim 1, wherein
refractive index of the light transmissive insulating layer is greater than refractive index of the light transmissive conducting layer.

8. The light emitting element according to claim 7, wherein
the light transmissive conducting layer is made up of an oxide containing one or more elements selected from the group having zinc, indium, tin and magnesium.

9. The light emitting element according to claim 7, wherein
the light transmissive insulating layer is formed of SiN or SiON.

10. The light emitting element according to claim 9, wherein
thickness of the light transmissive insulating layer is in a range of 100 nm to 200 nm.

11. The light emitting element according to claim 9, wherein
the light transmissive conducting layer is made up of an oxide containing one or more elements selected from the group having zinc, indium, tin and magnesium.

12. The light emitting element according to claim 1, wherein
refractive index of the light transmissive insulating layer is less than refractive index of the second semiconductor layer being in contact with the light transmissive insulating layer.

13. The light emitting element according to claim 12, wherein
the semiconductor stack is made up of a nitride semiconductor.

14. The light emitting element according to claim 12, wherein
the light transmissive insulating layer is formed of SiN or SiON.

15. The light emitting element according to claim 14, wherein
thickness of the light transmissive insulating layer is in a range of 100 nm to 200 nm.

16. The light emitting element according to claim 12 wherein
refractive index of the light transmissive insulating layer is greater than refractive index of the light transmissive conducting layer.

17. The light emitting element according to claim 16, wherein
the light transmissive conducting layer is made up of an oxide containing one or more elements selected from the group having zinc, indium, tin and magnesium.

18. The light emitting element according to claim 16, wherein
   the light transmissive insulating layer is formed of SiN or SiON.

19. The light emitting element according to claim 18, wherein
   thickness of the light transmissive insulating layer is in a range of 100 nm to 200 nm.

* * * * *